United States Patent [19]

Perregaux

[11] Patent Number: 5,552,828

[45] Date of Patent: Sep. 3, 1996

[54] GEOMETRIES FOR PHOTOSITES IN A PHOTOSENSITIVE SILICON CHIP

[75] Inventor: Alain E. Perregaux, Pittsford, N.Y.

[73] Assignee: Xerox Corporation, Stamford, Conn.

[21] Appl. No.: 516,223

[22] Filed: Aug. 17, 1995

[51] Int. Cl.⁶ .................................................. H04N 5/335
[52] U.S. Cl. ...................... 348/315; 348/311; 250/214.1; 257/234; 358/483
[58] Field of Search ..................................... 358/482, 483; 382/284; 348/294, 371, 375; 250/208.1, 214.1, 578.1; 257/234; H04N 5/335

[56] References Cited

U.S. PATENT DOCUMENTS

| | | | |
|---|---|---|---|
| 4,644,411 | 2/1987 | Sato et al. ................................ | 358/294 |
| 5,329,149 | 7/1994 | Kawahara et al. ....................... | 257/435 |
| 5,351,309 | 9/1994 | Lee et al. ................................. | 382/22 |
| 5,493,410 | 2/1996 | Oikawa .................................... | 358/298 |

Primary Examiner—Wendy Garber
Assistant Examiner—Ngoc-Yen Vu
Attorney, Agent, or Firm—R. Hutter

[57] ABSTRACT

In a hard-copy scanner in which a set of photosensitive silicon chips are abutted to form a single page-width array of photosensors, the photosites at the critical ends of each chip are specially shaped to ensure an even spacing of all photosites along the array, taking into account imprecisions in the dimensions of individual chips. The special shape of the end photosite is trapezoidal or a variation of trapezoidal.

11 Claims, 2 Drawing Sheets

GEOMETRIES FOR PHOTOSITES IN A PHOTOSENSITIVE SILICON CHIP

FIELD OF THE INVENTION

The present invention relates to photosensitive chips for creating electrical signals from an original image, as would be found, for example, in a digital scanner or facsimile machine.

BACKGROUND OF THE INVENTION

Image sensor arrays typically comprise a linear array of photosensors which raster scan an image bearing document and convert the microscopic image areas viewed by each photosensor to image signal charges. Following an integration period, the image signal charges are amplified and transferred as an analog video signal to a common output line or bus through successively actuated multiplexing transistors.

For high-performance image sensor arrays, a preferred design includes an array of photosensors of a width comparable to the width of a page being scanned, to permit one-to-one imaging generally without the use of reductive optics. In order to provide such a "full-width" array, however, relatively large silicon structures must be used to define the large number of photosensors. A preferred technique to create such a large array is to align several butted silicon chips, each chip defining a small linear array thereon. In one proposed design, an array is intended to comprise up to twenty silicon chips, butted end-to-end, each chip having 248 active photosensors spaced at 400 photosensors per inch.

The silicon chips which are butted to form a single full-width array are typically created by first creating the circuitry for a plurality of individual chips on a single silicon wafer. The silicon wafer is then cut, or "diced," around the circuit areas to yield discrete chips. Typically, the technique for dicing the chips includes a combination of chemical etching and mechanical sawing. Because, on each chip, the photosensors are spaced with high resolution from one end of a chip to the other, the length of each diced chip from one end of the array thereon to the other requires precision dicing. It would be desirable to dice each individual chip with a precise dimension along the linear array of photosensors, so that, when a series of chips are butted end-to-end to form a single page-width linear array, there is a minimum disruption of spacing from an end photosensor on one chip to a neighboring photosensor at the end of a neighboring chip. Ideally, the spacing, or pitch, across an entire full-width linear array should be consistent regardless of the configuration of silicon chips forming the array.

DESCRIPTION OF THE PRIOR ART

U.S. Pat. No. 4,644,411 discloses an extended image sensor comprising a plurality of linearly arranged line sensors, in the form of chips, each chip having a plurality of photosensors thereon. The photosites, that is the main photosensitive areas of the photosensors, positioned at the ends of the linear arrangement on each chip are smaller in width in the direction of the linear arrangement than the photosites positioned in the central portion of each chip. Thus, the smaller photosites at the ends of each chip can be spaced a fairly significant distance from the edge of each chip, thereby allowing some room for length variation among a large set of chips of the same design. Because the end photosites on each chip are made shorter along the length of the linear array, the end photosite is made slightly longer in the lead-and-trail direction of the linear array, so that the end photosite will have generally the same surface area as the regular photosites. However, as shown in FIG. 4 of the patent, these specially-shaped end photosites may not be evenly spaced relative to the regular photosites within each chip: because the end photosites are relatively long and narrow, the geometric center of the end photosite is closer to the geometric center of the neighboring photosite than would be the case between two adjacent regular photosites.

The present invention posits proposed designs for the shape of the end photosite on a particular individual chip, so that, when a plurality of chips of a particular design are butted end-to-end, the shape of the end photosite facilitates spacing the end photosite a reasonable distance from the critical edge of the chip, while also maintaining a reasonable consistency of spacing of the geometric centers of all of the photosites.

SUMMARY OF THE INVENTION

According to the present invention, there is provided a photosensitive device having a plurality of photosites disposed on a surface thereof. The photosites comprise regular photosites forming a linear array and an end photosite disposed at the end of the linear array. Each regular photosite defines at least a first side edge and a second side edge, each side edge positioned to be adjacent a neighboring photosite in the linear array. The end photosite defines a lead edge, a trail edge, an inner edge adjacent a neighboring photosite in the linear array, and an outer edge adjacent an edge of the surface of the device. The outer edge is longer than the inner edge.

DETAILED DESCRIPTION OF THE INVENTION

Figure 1:
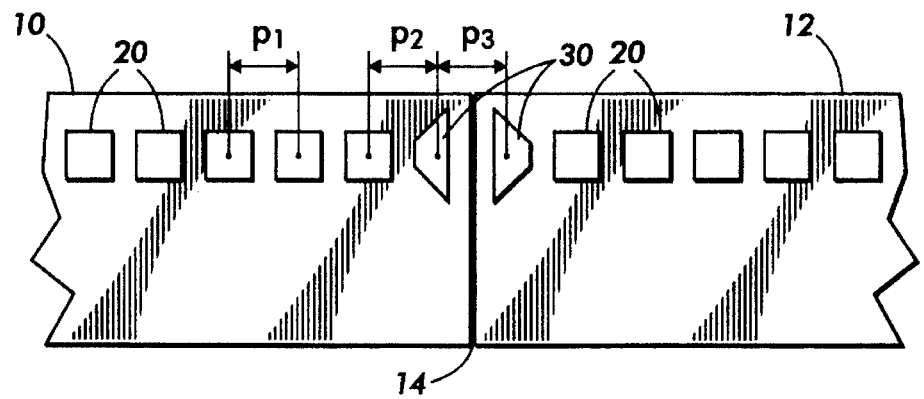
FIG. 1 is a plan view showing portions of two abutting photosensitive chips, showing regular photosites and end photosites thereon, according to one embodiment of the present invention.

In each of the following Figures, there is shown a plan view of the relevant portions of two silicon chips 10 and 12 at the general area of abutment along a linear array comprising a plurality of such chips. In this plan view is shown only the main surfaces of the chips, having photosesnitive structures thereon. At the abutment area between chips 10 and 12 is a gap 14, which represents a spacing between the edges of each chip; such a finite gap 14 may or may not be desirable in various assembly processes. Each chip 10, 12 includes on the main surface thereof a plurality of "regular" photosites 20, which are regularly-spaced in a linear array on each chip. At at least one end of the linear array formed by regular photosites 20 on each chip, there is disposed a specially-shaped end photosite. Each photosite, be it a regular photosite 20 or a special end photosite, represents the effective photosensitive area associated with a circuit (not shown) forming a photosensor in the chip. For purposes of the present invention, the most relevant attribute of each photosensor is the geometric shape and spacing of the photosites. The photosites are formed in the silicon chip through known integrated-circuit techniques, and may further be provided with translucent color filters placed thereover. As described in the claims herein, the chip such as 10 or 12 is called a "device," and need not be in the form of a silicon integrated-circuit chip.

As shown in each of the Figures, all of the photosites, whether regular photosites or end photosites, define a lead edge, which is here shown as the top end in the orientation of the Figures, and a trail edge, which is shown as the bottom edge of each photosite in the orientation of the Figures. The terms lead and trail edges are used to indicate that an original document or other hard-copy image is caused to move in a direction perpendicular to the direction of orientation of the linear array, which would be a vertical direction as shown in the Figures. In this way, over time, each photosite is exposed to a series of discrete small areas in the original image, and receives light reflected from the hard-copy image in order to yield digital data based on the original image.

FIG. 1 shows a first embodiment of the present invention. Each end photosite, indicated as 30, is shaped so that an outer edge thereof, immediately adjacent the edge of the main surface of each chip, is longer than the inner edge thereof, which faces the linear array of regular photosites 20. On the whole, this arrangement shown in FIG. 1 creates end photosites 30 which are generally trapezoidal in shape.

The advantage of the generally trapezoidal shape of end photosites 30 in the embodiment of FIG. 1 is that, while the overall width of each end photosite 30 is equal to that of each regular photosite 20, the geometric center of the end photosites 30 is made slightly closer to the edge of the chip near gap 14 than would be possible with a square or rectangular photosite. The extended length of the outer edge of end photosite 30 allows slightly more light from the area near the gap 14 in the original image being scanned to affect the end photosite 30. Because the geometric centers of the end photosite are made slightly closer to the edge of each chip near gap 14, any spacing distance caused by gap 14 between adjacent end photosites 30 can be somewhat compensated for. In other words, if the end photosites 30 were identical in shape and spacing to the regular photosites 20, the presence of gap 14, which is typically inevitable in the dicing and butting process, would cause the end photosites to have a greater spacing from each other than the spacing between adjacent photosites 20 within each chip. The trapezoidal shape of end photosite 30 can, in effect, push the geometric center of the end photosite slightly closer to the gap 14, thus compensating for the additional spacing between the edges of the end photosites 30 caused by gap 14.

As shown in FIG. 1, the pitches, or distances between the geometrical centers, of neighboring photosites within a chip and between chips can be manipulated by the size and shape of the end and regular photosites. As shown in chip 10 in FIG. 1, the regular photosites 20 are spaced by a pitch $p_1$ between adjacent centers thereof. The pitch $p_2$ between the last regular photosite 20 and an end photosite 30 can be made either equal to $p_1$, or, depending on the specific dimension of the end photosite 30, slightly larger than the regular pitch $p_1$. The pitch $p_2$ may be desired to be slightly longer than $p_1$ to compensate for the spacing between the geometric centers of adjacent end photosites 30 in adjacent chips 10, 12 across gap 14. This inter-chip spacing is shown as $p_3$. Ideally, the pitches $p_1$, $p_2$, and $p_3$ could be made exactly equal, by careful consideration of the dimensions of end photosite 30, and the effective length of pitch $p_3$ caused by the gap 14 between chips.

Another factor affecting the length of $p_3$ is the precise length of each chip 10, 12 between the outer edge of the end photosite 30 and the edge of the chip: this dimension is highly dependent on the precision of the dicing process, and can be expected to have a certain degree of error distribution therein. To approach the ideal situation of equal pitches $p_1$, $p_2$, $p_3$ it may be desirable to make the pitch $p_2$ slightly longer than $p_1$, in order to compensate for $p_3$; or else make $p_2$ on each chip equal to $p_1$, and, by using highly precise methods in dicing chips 10, 12, have a controllable width of gap 14 in order to obtain a $p_3$ which is as close as possible to $P_2$ and $p_1$. Fine judgments on proper selection of $p_1$, $p_2$, and the desired distance between the outer edge of end photosite 30 and the edge of the chip will depend, for example, on the availability of precision dicing or other factors.

Figure 2:
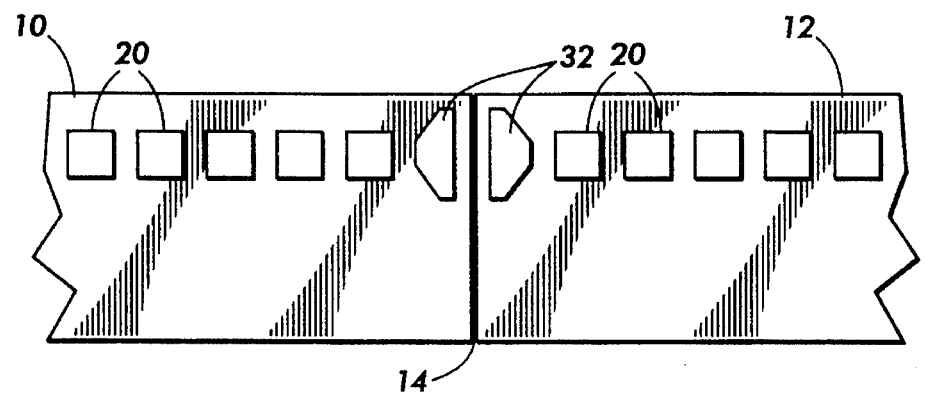
FIG. 2 is a plan view showing portions of two abutting photosensitive chips, showing regular photosites and end photosites thereon, according to another embodiment of the present invention.
Figure 3:
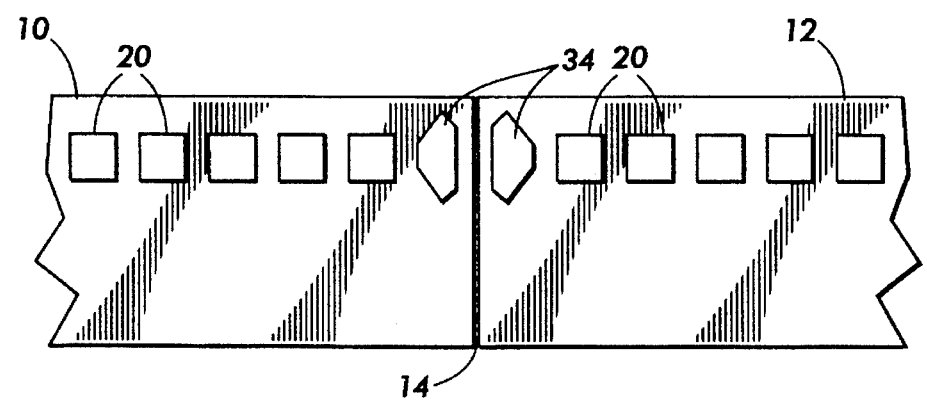
FIG. 3 is a plan view showing portions of two abutting photosensitive chips, showing regular photosites and end photosites thereon, according to another embodiment of the present invention.

FIG. 2 shows another embodiment of the present invention, in which the end photosites, here indicated as 32, are shaped with a combination of trapezoidal and rectangular shapes. This truncated-trapezoidal shape may be useful, for example, if there is a limited amount of space to extend the end photosites along the lead-and-trail direction orthogonal to the direction of the linear arrays on the chips. Similarly, FIG. 3 shows another possible design, wherein the end photosites 34 have a distorted-hexagonal shape. In the FIG. 3 embodiment the lead edge and trail edge of the end photosites 34 are so shaped that a total length of the end photosite between the lead edge and the trail edge is longer than the outer edge facing gap 14.

Figure 4:
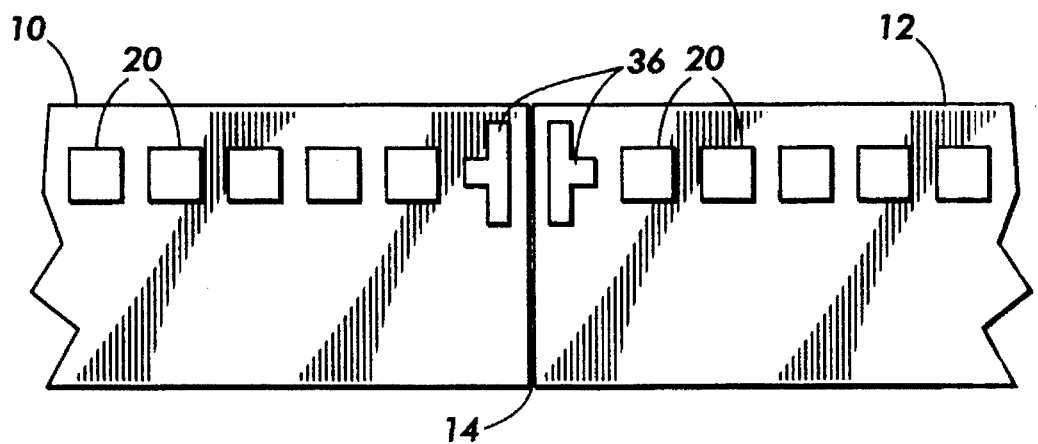
FIG. 4 is a plan view showing portions of two abutting photosensitive chips, showing regular photosites and end photosites thereon, according to another embodiment of the present invention.
Figure 5:
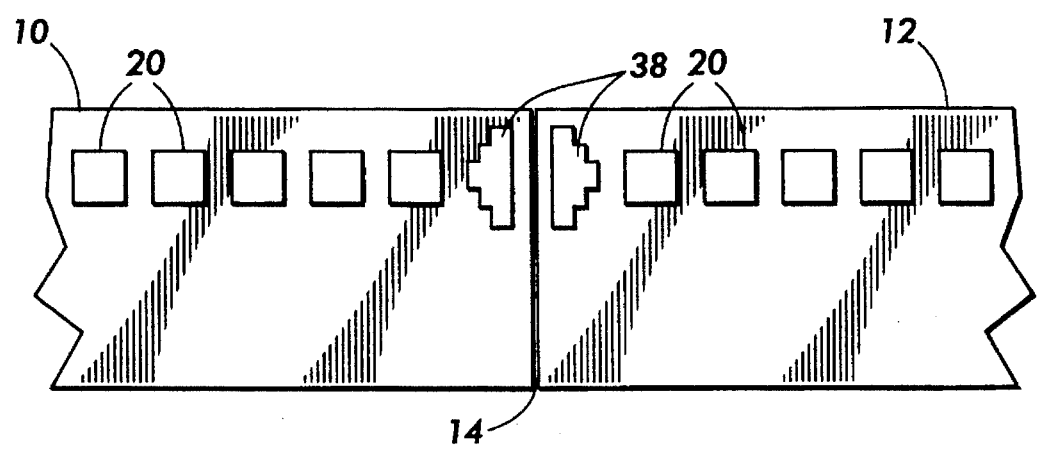
FIG. 5 is a plan view showing portions of two abutting photosensitive chips, showing regular photosites and end photosites thereon, according to another embodiment of the present invention.

Another variation to the photosite design of the present invention is to shape the end photosite in a stepped fashion, in order to yield the effect of, for example, a trapezoidal end photosite but without the possible difficulty of forming diagonal borders of the photosites. FIG. 4 shows a chip design in which the end photosites, indicated as 36, have lead and trail edges both formed of two steps, as shown. FIG. 5 shows a chip design in which the lead and trail edges of the end photosite 38 each comprise three steps. Here, the intention is to simulate the desirable aspects of a trapezoidal-shaped end photosite, with its attendant advantages of having the geometric center of the end photosites pushed slightly closer to the edge of each chip 10, 12, thereby compensating for a gap 14 between the chips.

It is desirable that the end photosite, no matter what the specific shape thereof, be of a surface area equal to the surface area defined by each regular photosite. By having equal surface areas of the end photosite and the regular photosites, the overall light sensitivity of all of the photosites, no matter of which type, can be made equal; and therefore external compensations, such as a filter or special circuitry, will not be required to equalize the response of the end photosite and the regular photosites. Further, according to a preferred embodiment of the invention, the width of the end photosite 30 between the inner and outer edges thereof is equal to the spacing between the side edges of each regular photosite 20.

While this invention has been described in conjunction with various embodiments, it is evident that many alternatives, modifications, and variations will be apparent to those skilled in the art. Accordingly, it is intended to embrace all such alternatives, modifications, and variations as fall within the spirit and broad scope of the appended claims.

I claim:

1. A photosensitive device having a plurality of photosites disposed on a surface thereof, the photosites comprising regular photosites forming a linear array and an end photosite disposed at the end of the linear array, each regular photosite defining at least a first side edge and a second side edge, each side edge positioned to be adjacent a neighboring photosite in the linear array, and the end photosite defining a lead edge, a trail edge, an inner edge adjacent a neighboring photosite in the linear array, and an outer edge adjacent an edge of the surface of the device, the outer edge being longer than the inner edge.

2. The device of claim 1, the end photosite defining a width between the inner edge and the outer edge equal to a width between the first side edge and the second side edge of each regular photosite.

3. The device of claim 1, the end photosite defining a surface area equal to a surface area of each regular photosite.

4. The device of claim 1, the end photosite being generally trapezoidal in shape.

5. The device of claim 1, at least one of the lead edge and trail edge of the end photosite having a step configuration.

6. The device of claim 1, each photosite defining a geometrical center, each pair of neighboring photosites defining a pitch between the geometrical centers thereof, the pitch between the end photosite and a neighboring regular photosite being equal to a pitch between two neighboring regular photosites.

7. The device of claim 1, each photosite defining a geometrical center, each pair of neighboring photosites defining a pitch between the geometrical centers thereof, the pitch between the end photosite and a neighboring regular photosite being longer than a pitch between two neighboring regular photosites.

8. The device of claim 1, the end photosite defining a width from the inner edge to the outer edge thereof equal to a width of a regular photosite from the first side edge to the second side edge thereof.

9. The device of claim 1, the end photosite defining a width from the inner edge to the outer edge thereof equal to a width of every regular photosite on the device from the first side edge to the second side edge thereof.

10. The device of claim 1, at least one of the lead edge or trail edge of the end photosite being so shaped that a total length of the end photosite from a point on the lead edge to point on the trail edge is longer than the outer edge.

11. The device of claim 1, wherein the end photosite defines six straight sides.

* * * * *